(12) United States Patent
Hasegawa et al.

(10) Patent No.: US 6,491,758 B1
(45) Date of Patent: Dec. 10, 2002

(54) CVD APPARATUS EQUIPPED WITH MOISTURE MONITORING

(75) Inventors: Hiroyuki Hasegawa, Tokyo (JP); Tomonori Yamaoka, Tokyo (JP); Hiroshi Masusaki, Tokyo (JP); Takayuki Satou, Tokyo (JP); Katsumasa Suzuki, Tokyo (JP); Hiroki Tokunaga, Tokyo (JP)

(73) Assignees: Mitsubishi Materials Silicon Corporation, Tokyo (JP); Nippon Sanso Corporation, Tokyo (JP)

( * ) Notice: Subject to any disclaimer, the term of this patent is extended or adjusted under 35 U.S.C. 154(b) by 0 days.

(21) Appl. No.: 09/651,255

(22) Filed: Aug. 30, 2000

(30) Foreign Application Priority Data

| Aug. 31, 1999 | (JP) | ............................... 11-246240 |
| Feb. 28, 2000 | (JP) | ..................................... 2000-052516 |
| Feb. 28, 2000 | (JP) | ..................................... 2000-052555 |

(51) Int. Cl.⁷ .......................... C23C 16/00; G01N 7/00
(52) U.S. Cl. ..................................... 118/715; 73/29.01
(58) Field of Search .................... 118/712, 715, 118/719, 724, 70, 75; 73/29.01, 29.05

(56) References Cited

U.S. PATENT DOCUMENTS

| 6,154,284 | A | * | 11/2000 | McAndrew et al. | .......... 216/60 |
| 6,188,475 | B1 | * | 2/2001 | Inman et al. | ................ 356/246 |
| 6,193,811 | B1 | * | 2/2001 | Sundarrajan et al. | ......... 134/19 |
| 6,239,044 | B1 | * | 5/2001 | Kashiwagi et al. | ......... 438/787 |

FOREIGN PATENT DOCUMENTS

| EP | 09/68753 | 5/2000 |
| JP | 5-99845 | 4/1993 |
| JP | 11-57390 | 3/1999 |
| JP | WO 99/30809 | 6/1999 |
| JP | 11-183366 | 7/1999 |

OTHER PUBLICATIONS

Nippon Sanso Technical Reports, Masusaki et al., "Monitoring of Impurities in Si Epitaxial Gases by Use of Near–Infrared Laser Diode Spectroscopy", No. 18, (Dec. 3, 1999) pp. 32–33.

Microsystems Technology Laboratories Annual Report, Massachusetts Institute of Technology (May 1999).

* cited by examiner

*Primary Examiner*—Michael Sherry
*Assistant Examiner*—Evan Pert
(74) *Attorney, Agent, or Firm*—Pillsbury Winthrop LLP

(57) ABSTRACT

A CVD apparatus is able to efficiently perform purging treatment after maintenance by using for the purge gas a mixed gas of a high thermal conductivity and an inert gas. Purging treatment before semiconductor film formation is performed by repeating the pumping of a vacuum and the introduction of inert gas a plurality of times. In addition, in order to judge suitable maintenance times, the moisture concentration in reaction chamber is measured with a moisture meter connected to the reaction chamber when performing a corrosive gas treatment, and maintenance times are determined according to changes in the moisture concentration when corrosive gas treatment is performed repeatedly. In addition, in order to measure the moisture of corrosive gas while preventing obstruction of piping in a moisture monitoring apparatus, a moisture monitoring apparatus, including a pipe, of which one end is connected to reaction chamber into which corrosive gas flows, and a moisture meter connected to the other end which measures the moisture contained in the corrosive gas introduced from the reaction chamber, is equipped with a pipe beating mechanism.

9 Claims, 9 Drawing Sheets

CVD APPARATUS EQUIPPED WITH MOISTURE MONITORING

BACKGROUND OF THE INVENTION

1. Field of the Invention

The present invention relates to a CVD apparatus and its purging method, and more particularly, to the composition of a CVD apparatus that is able to shorten the time required for purging treatment after performing maintenance, and its purging method.

In addition, the present invention relates to a moisture monitoring apparatus that measures the moisture contained in corrosive gas in the process when performing epitaxial growth and so forth using corrosive gas on a silicon wafer arranged in, for example, a reactor, a semiconductor production apparatus equipped with said moisture monitoring apparatus, and a method for judging the maintenance times of semiconductor production apparatuses.

2. Description of the Related Art

CVD apparatuses are apparatuses used to grow a semiconductor film on a wafer by chemically reacting a semiconductor gas introduced into a reactor on the wafer. However, since it is not possible in principle to react all material gases on the wafer, by-products end up adhering to various locations on the inside walls of the reactor. These by-products have an effect during film growth in the form of particles and so forth. Since they hinder the formation of a high-quality film, it is necessary to perform cleaning work (maintenance) on the inside walls of the reactor.

In a CVD apparatus for growing thick films, for example, maintenance is required on the order of once every 3–4 days. However, since the apparatus is opened to the atmosphere and is cleaned with alcohol and so forth during maintenance, a large amount of air is taken into the reactor resulting in the adherence of moisture on the inside walls of the reactor.

If moisture is present in the atmosphere during growth of semiconductor films, it reacts with the semiconductor material gas resulting in the formation of metal impurities or the formation of particles that worsen the film quality. Consequently, following maintenance, it is necessary to purge the inside of the apparatus with high-purity nitrogen or other insert gas before growing films to lower the moisture concentration to an extent that does not have a detrimental effect on film quality.

However, since the inside of CVD apparatuses have an extremely complex shape, and the adsorption strength of water molecules is extremely high, considerable time is required for removing moisture after maintenance, which in turn has a significant effect on the operation rate of the apparatus.

In the past, various contrivances have been made to shorten the time required for apparatus maintenance, including purging, examples of which include vacuum purging, heated purging (baking), the use of hydrogen or a combination of these. However, since the conditions and combination of vacuum purging and baking are determined based on experience, it has been difficult to optimize the purging method.

In addition, the completion of purging is judged based on an evaluation of the quality of a film that is actually grown following a certain degree of purging. Consequently, material gas and time were wasted on growth until a film having product level quality was obtained. This is referred to as wasted epitaxial growth. Since the amount of time required for purging varies according to the usage history of the CVD apparatus and the degree to which maintenance has been performed, there were cases in which the number of cycles of wasted epitaxial growth increased considerably.

In recent years, epitaxial wafers, in which a single crystal silicon thin film (epitaxial layer) is vapor deposited at a prescribed impurity concentration on a silicon wafer having extremely low resistivity, are produced with an epitaxial crystal growth apparatus for use as silicon wafers for MOS devices. This apparatus performs epitaxial growth on a wafer by allowing a corrosive source gas to flow into a chamber in which a silicon wafer has been arranged. Furthermore, in this apparatus, etching of polysilicon adhered inside the chamber is also performed by a corrosive gas in the form of hydrogen chloride gas.

In addition, various CVD apparatuses that form a thin film on a wafer using corrosive gas, or etching devices for performing patterning, are used in LSI and other semiconductor production processes.

Although these semiconductor production apparatuses use corrosive gases such as ultra-high-purity hydrogen chloride gas and ammonia gas, if even a slight amount of moisture is present in this gas, there is increased susceptibility to the occurrence of corrosion of metal parts used in the apparatus (such as the inside of the process chamber, gas supply system and gas exhaust system), which is harmful because it causes contamination by metals (heavy metals) produced from these metal parts. In addition, moisture taken into the chamber reacts with by-products adhering to the chamber inside walls and exhaust line, which may also be the cause of particle formation. Consequently, although various countermeasures are employed to reduce moisture inside the process chamber, it is difficult to completely remove all moisture. It is therefore necessary to periodically perform apparatus maintenance, namely opening up the process chamber and cleaning the members inside (quartz jigs, etc.). In the past, for example, maintenance times were judged based on the cumulative number of wafers processed in the case of single-wafer CVD apparatuses.

However, the above conventional method of judging maintenance times still has the problems indicated below. Namely, the amount of moisture actually introduced into the chamber each time maintenance is performed varies depending on the contents of work performed and the amount of time the chamber is opened during maintenance. Thus, in the case of judging maintenance times based on the cumulative number of wafers processed as has been done in the past, maintenance is performed for every fixed number of processing cycles regardless of the amount of moisture actually introduced into the chamber, and there was no guarantee that maintenance is performed at suitable times. For example, in the case an amount of moisture was introduced during the previous round of maintenance that is greater than the expected amount, there was the risk of high film quality not being obtained if processing is not performed until the prescribed cumulative number of wafers processed. In addition, in the case the amount of moisture introduced during the previous round of maintenance is comparatively low, maintenance ends up being performed earlier than the time when maintenance is actually required, leading to an excessively high number of maintenance cycles and decreased throughput.

In addition, it is also required to quantitatively analyze with high sensitivity the moisture contained in, corrosive gas inside the chamber in terms of reducing the moisture in the process chamber.

Known examples of moisture meters for measuring the moisture in a gas include the crystal oscillator method in which changes in the frequency of a crystal oscillator are measured, and the electrostatic capacitance method in which changes in electrostatic capacitance are measured by adsorbing moisture in a gas. However, since these moisture meters require direct contact with the gas, measurement was unable to be performed in the case of corrosive gases due to the corrosive nature of these gases.

Therefore, a laser moisture meter has been proposed in recent years, such as that described in Japanese Unexamined Patent Application, First Publication No. Hei 5-99845 and Japanese Unexamined Patent Application, First Publication No. Hei 11-183366, that uses infrared absorption spectrometry to measure trace amounts of impurities contained in gases using laser light. This laser moisture meter detects impurities such as moisture based on the intensity of the absorption wavelength by analyzing transmitted laser light when laser light having a prescribed wavelength is directed at a measurement cell while introducing corrosive gas into the measurement cell. Thus, there is no need to adsorb the corrosive gas and measurements can be performed quickly and with high sensitivity.

However, measurement means using the above moisture meter of the background art still have the problems indicated below. Namely, although a portion of the corrosive gas is introduced into the above moisture meter after passing through a sampling pipe after being heated inside a chamber, reaction by-products end up adhering and accumulating on the inside walls of the sampling pipe that leads to the moisture meter, resulting in the risk of obstruction of the sampling pipe. Consequently, it was difficult to use this moisture meter for constant measurement of moisture in corrosive gases during the process, namely for in situ monitoring.

BRIEF SUMMARY OF THE INVENTION

Therefore, a first object of the present invention is to provide a CVD apparatus and its purging method that allows purging treatment after maintenance to be performed efficiently, makes it possible to accurately determine completion of purging treatment, shortens the time required for purging treatment, and makes it possible to quickly start up the CVD apparatus.

In addition, a second object of the present invention is to provide a method for judging maintenance times of semiconductor production apparatuses that is able to determine suitable maintenance times.

Moreover, a third object of the present invention is to provide a moisture monitoring apparatus and a semiconductor production apparatus equipped with said moisture monitoring apparatus that prevents obstruction of a pipe and allows measurement of moisture contained in corrosive gas even during processing.

In order to achieve the above first object, the CVD apparatus of the present invention comprises a CVD apparatus that supplies semiconductor material gas to a reactor (reaction chamber) in which a wafer is placed to form a semiconductor film on said wafer; wherein, together with connecting a material gas supply path that supplies said semiconductor material gas, an inert gas supply path that supplies inert gas for purging, and a high thermal conductivity gas supply path that supplies gas such as hydrogen or helium having a high coefficient of thermal conductivity that mixes with purge gas, to said reactor, a moisture meter that measures the amount of moisture in gas exhausted from the reactor, and a vacuum pump for evacuating the inside of the reactor, are provided.

In addition, in order to achieve the above first object, the purging method of the CVD apparatus of the present invention comprises a purging method of a CVD apparatus that supplies semiconductor material gas to a reactor (reaction chamber) in which a wafer is placed to form a semiconductor film on said wafer; wherein, a gas consisting of a mixture of a gas such as hydrogen or helium having a high coefficient of thermal conductivity and an inert gas, is used as the purge gas used during heated flow purging treatment in a purging treatment following maintenance, and the pumping of a vacuum inside the reaction chamber and the introduction of inert gas are repeated a plurality of times.

According to the CVD apparatus and purging method of a CVD apparatus of the present invention, purging treatment of the reactor can be performed efficiently, and timing of the start of film growth can be accurately determined. Therefore, the operating efficiency of the CVD apparatus can be improved and wasted epitaxial growth can be eliminated, thereby making it possible to reduce waste of material gas and time.

In order to achieve the above second object, the method for judging the maintenance times of semiconductor production apparatuses of the present invention comprises a method for judging the maintenance times of semiconductor production apparatuses that perform corrosive gas treatment in a reaction chamber by measuring the moisture concentration in the reaction chamber with a moisture meter connected to said reaction chamber when performing said corrosive gas treatment, and determining said maintenance times according to changes in said moisture concentration when corrosive gas treatment is performed repeatedly.

In this method for judging the maintenance times of semiconductor production apparatuses, since the moisture concentration in a reaction chamber is measured with a: moisture meter connected to the reaction chamber when performing corrosive gas treatment to determine maintenance times according to changes in moisture concentration when corrosive gas treatment is performed repeatedly, suitable maintenance times can be accurately judged since said moisture concentration changes according to the amount of moisture actually taken into the reaction chamber. Thus, in addition to being able to maintain the apparatus in a satisfactory state at all times, the number of times maintenance is performed can be reduced and maintenance intervals can be extended, making it possible to improve throughput.

In addition, it is preferable that the method for judging maintenance times of semiconductor production apparatuses of the present invention determine said maintenance times according to the cumulative amount of moisture by calculating the cumulative amount of moisture that has accumulated from the previous round of maintenance and been taken into said reaction chamber based on said change in moisture concentration.

Since maintenance times are determined according,to the cumulative amount of moisture as calculated from the change in moisture concentration in this method for judging maintenance times of semiconductor production apparatuses, the amount of moisture that is actually taken into the reaction chamber can be estimated accurately, thereby making it easy to judge suitable maintenance times.

Moreover, it is preferable that the method for judging maintenance times of semiconductor production apparatuses of the present invention measure the pressure inside the reaction chamber with a pressure gauge connected to said reaction chamber when performing said corrosive gas treatment, and determine said maintenance times according to said cumulative amount of moisture and the change in said pressure when corrosive gas treatment is performed repeatedly.

Since maintenance times are determined according to the change in pressure inside the reaction chamber and the cumulative amount of moisture in this method for judging maintenance times of semiconductor production apparatuses, even more suitable maintenance times can be determined Since the flow status of the pipe of the exhaust system, such as fluctuations in pressure that occur when the pipe is obstructed, can be detected from changes in pressure inside the reaction chamber, and this flow status can be taken into consideration along with moisture concentration.

In addition, it is preferable that the method for judging maintenance times of semiconductor production apparatuses of the present invention be a laser moisture meter in which said moisture meter directs laser light into a tubular cell. body connected to said reaction chamber and measures the absorption spectrum of the transmitted laser light.

In recent years, a laser moisture meter has been proposed in, for example, Japanese Unexamined Patent Application, First Publication No. Hei 5-99845 and Japanese Unexamined Patent Application, First Publication No. Hei 11-183366 that directs laser light into a tubular cell body connected to a process chamber and measures the absorption spectrum of the transmitted laser light as a means of measuring the moisture concentration in corrosive gases. Since this laser moisture meter is able to measure moisture concentration without making contact with corrosive gas, measurements can be made with high accuracy even in corrosive gas. Namely, since the above, method for judging maintenance times of semiconductor production apparatuses uses the above laser moisture meter for its moisture meter, moisture concentration in the reaction chamber can be measured accurately even while the process is n progress, thereby making it possible to determine maintenance times with high precision.

In order to achieve the above third object, the moisture monitoring apparatus of the present invention is a moisture monitoring apparatus equipped with a pipe of which one end is connected to a reaction chamber into which flows corrosive gas, and a moisture meter connected to the other end of said pipe that measures moisture contained in corrosive gas introduced from said reaction chamber, in which technology is employed that is at least provided with a pipe heating mechanism that heats said pipe.

Since this moisture monitoring apparatus is at least equipped with a pipe heating mechanism that heats a pipe, the pipe can be heated to a prescribed high temperature, enabling corrosive gas heated in the reaction chamber to flow while preventing the adhesion and deposition of reaction by-products in the pipe. Thus, obstruction of the pipe can be prevented enabling moisture to be measured constantly even while the process is in progress.

The above pipe heating mechanism can be in the form of a heating wire coiled around the outside of the above pipe in the above moisture monitoring apparatus.

Since the pipe heating mechanism in this moisture monitoring apparatus is equipped with a heating wire coiled around the outside of a pipe, the pipe can be heated with a simple configuration and the temperature of the pipe can be easily controlled by adjusting the current supplied to the eating wire.

Furthermore, the heat insulating and heat retention properties of this heating wire may be improved by covering the wire with a heat-resistant insulating material.

The above moisture meter in the above moisture monitoring apparatus can be a laser moisture meter that directs laser light into a tubular cell body connected to the other end of said pipe and measures the absorption spectrum of the transmitted laser light.

Since the moisture meter in this moisture monitoring apparatus is a laser moisture meter that directs laser light into a tubular cell body connected to the other end of said pipe and measures the absorption spectrum of the transmitted laser light, moisture can be quantitatively analyzed with high precision even in corrosive gas.

The above moisture meter in the above moisture monitoring apparatus may be equipped with a cell heating mechanism that heats the above tubular cell body.

Since the moisture meter in this moisture monitoring apparatus is equipped with a cell heating mechanism that heats the tubular cell body, the tubular cell body is also heated and the adhesion and deposition of reaction by-products inside the cell can be prevented, thereby enabling measurements to be made with high accuracy at all times. Thus, moisture can be quantitatively analyzed rapidly and with high sensitivity even during processing, and the correlation between the quality and conditions of corrosive gas crystal growth, thin film formation and etching and moisture content can be obtained with high accuracy, thereby making it possible to produce high-quality semiconductor wafers, semiconductor devices and other semiconductor apparatuses.

The above moisture meter in the above moisture monitoring apparatus may be composed such that the measurement sensitivity can be adjusted corresponding to the temperature of the above heated corrosive gas.

Some moisture meters are subject to variations in measurement sensitivity following a change in the temperature of the measured gas, and in the case of moisture meters: such as laser moisture meters that require a high level of measurement accuracy in particular, the effects of temperature cannot be ignored. However, since measurement sensitivity of the moisture meter is controlled corresponding to the temperature of the heated corrosive gas in this moisture monitoring apparatus, even if the temperature of corrosive gas being measured is changed by the pipe heating mechanism and so forth, moisture concentration can be measured with high precision according to the adjusted and corrected measurement sensitivity of the moisture meter.

In order to achieve the above third object, the semiconductor production apparatus of the present invention is a semiconductor production apparatus that allows corrosive gas to flow onto a wafer in a reaction chamber and reacts the corrosive gas on the surface of the wafer, and is equipped with the above moisture monitoring apparatus.

Since this semiconductor production apparatus is equipped with the above moisture monitoring apparatus, moisture can be quantitatively analyzed with high sensitivity even during processing, and the correlation between the conditions and quality of crystal growth, thin film formation and etching by corrosive gas and moisture content can be obtained at high accuracy.

This semiconductor production apparatus may be provided with a wafer transport system that transports the above: wafer through sealed space to the above reaction chamber, and may be provided with a moisture meter in said wafer transport system that measures moisture in said sealed space separate from the above moisture meter.

Since the wafer transport system of this semiconductor production apparatus is equipped with a moisture meter that measures moisture in a sealed space separate from the above moisture meter, moisture in sealed space of the wafer transport system can be measured and confirmed separately during transport of a wafer into a reaction chamber with a wafer transport system, thereby being able to prevent inadvertent inflow of moisture in said sealed space into the reaction chamber.

DETAILED DESCRIPTION OF THE INVENTION

A. CVD Apparatus and CVD Apparatus Purging Method

Figure 1:
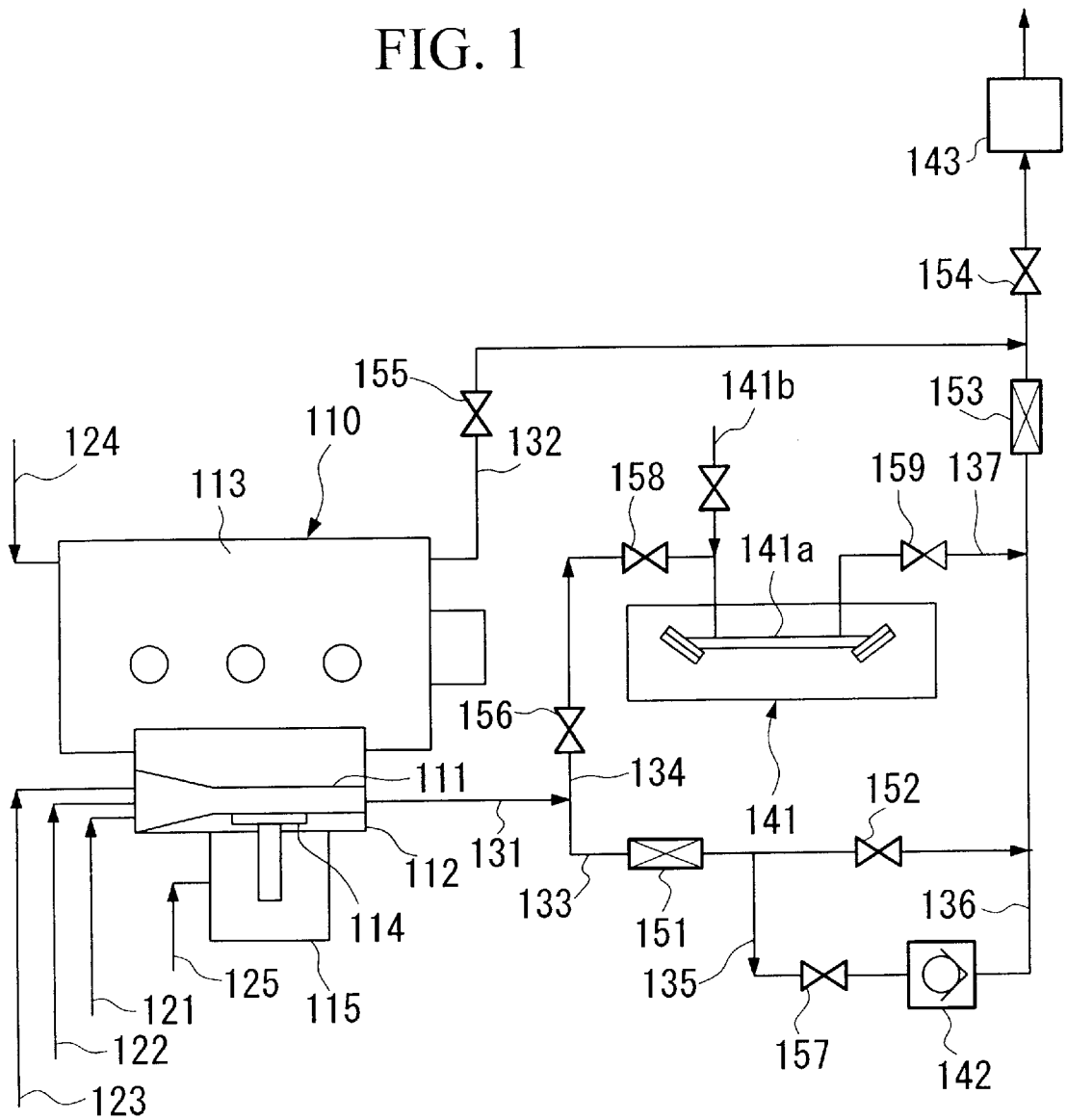
FIG. 1 is a system drawing showing one embodiment of a CVD apparatus of the present invention.

FIG. 1 is a system drawing showing one embodiment of the CVD apparatus of the present invention. CVD apparatus body 110 has reactor 112 provided with flow channel 111 inside, glove box 113 coupled to said reactor 112, and chamber,115 housing a rotating mechanism of receptor 114, a heater and so forth.

Material gas supply path 121 that supplies semiconductor material gas for forming a semiconductor film, inert gas supply path 122 that supplies inert gas for purging, high thermal conductivity gas supply path 123 that supplies a gas such as hydrogen or helium having a high coefficient of thermal conductivity that mixes with purge gas, and reactor exhaust path 131 that discharges gas from reactor 112 are connected to reactor 112. In addition, purge gas supply paths 124 and 125 that supply purge gas are respectively connected to glove box 113 and chamber 115, and glove box exhaust, path 132 is connected to glove box 113.

The above reactor exhaust path 131 branches to analysis path 134 and evacuation path 135 from main exhaust path 133, moisture meter 141, which measures the amount of moisture in gas discharged from reactor 112, is provided in analysis path 134, and vacuum pump 142, for evacuating the inside of reactor 112, is provided in evacuation path 135. The downstream side of this main exhaust path 133 is connected to detoxifying apparatus 143 after efferent path 136 from vacuum pump 142, efferent path 137 from moisture meter 141 and the above glove box exhaust path 132 are merged.

A moisture meter that is able to perform instantaneous measurement and continuous measurement is used for the above moisture meter 141. In addition, since a large amount of reaction products are contained in the gas discharged from the CVD apparatus even after maintenance, and reaction products evaporated by baking re-adhere when cooled, it is preferable that the detecting portion (cell 141a) of moisture meter 141 not make contact and that the portion through which exhaust gas flows is able to be heated. Moreover, since many CVD apparatuses do not employ a pressure-resistant design and the inside is at normal pressure or lower during purging, sampling should be able to be performed while at normal pressure. An example of a single moisture meter 141 that satisfies these conditions is a laser moisture meter that uses the near infrared absorption spectral analysis method in. which the laser as the light source and the detecting portion do not make contact with the measured gas, the entire flow path of the measured gas can be heated, and is equipped with a vacuum pump (not shown) in a stage after cell 141a.

During film growth, the CVD apparatus grows a semiconductor film on a wafer by supplying a prescribed composition of semiconductor material gas from material gas supply path 121 into reactor 112 while heating a wafer placed on receptor 114 (not shown) to a prescribed temperature. At this time, exhaust gas discharged from reactor 112 passes through reactor exhaust path 131, filter 151, valve 152, spare filter 153 and valve 154 after which it is discharged through detoxifying apparatus 143. In addition, purge gas for maintaining the insides of glove box 113 and chamber 115 in a clean state is respectively introduced from purge gas supply paths 124 and 125, and gas inside glove box 113 merges with exhaust gas of the above main exhaust path 133 after passing through valve 155 from glove box exhaust path 132. Gas inside chamber 115 is then discharged with the above exhaust gas by flowing into reactor 112 to which it is connected.

Purging treatment after the apparatus has been opened to the atmosphere by maintenance work involves performing batch purging in which two procedures are repeated, consisting first of a procedure in which the valves of each supply path are closed, the above valve 152 and valve 156 of analysis path 134 are closed, and vacuum pump 142 is operated with valve 157 of evacuation path 135 open so as to evacuate the inside of reactor 112 (vacuum purging), and a procedure in which hydrogen gas or other inert gas is introduced into reactor 112 from inert gas supply path 122 followed by restoring the pressure in reactor 112. At this time, high-purity nitrogen and so forth supplied from path 141b is allowed to flow through cell 141 a of moisture meter 141. Next, in addition to supplying hydrogen or other inert gas from inert gas supply path 122, hydrogen gas or other high thermal conductivity gas is supplied from high thermal conductivity gas supply path 123, and the inside of reactor 112 is heated to a prescribed temperature to perform baking purging. At this time, vacuum pump 142 is stopped, valve 157 is closed and valve 156 is opened. Moreover, valves 158 and 159 of moisture meter 141 are opened and a portion of the exhaust gas is introduced into moisture meter 141 to continuously measure the amount of moisture in the exhaust gas. The above batch purging and baking purging are repeated until the amount of moisture in the exhaust gas falls below a prescribed concentration. pressure in reactor 112. At this time, high-purity nitrogen and so forth supplied from path 141b is allowed to flow through cell 141a of moisture meter 141. Next, in addition to supplying hydrogen or other inert gas from inert gas supply path 122, hydrogen gas or other high thermal conductivity gas is supplied from high thermal conductivity gas supply path 123, and the inside of reactor 112 is heated to a prescribed temperature to perform baking purging. At this time, vacuum pump 142 is stopped, valve 157 is closed and valve 152 is opened. Moreover, valves 158 and 159 of moisture meter 141 are opened and a portion of the exhaust gas is introduced into moisture meter 141 to continuously measure the amount of moisture in the exhaust gas. The above batch purging and baking purging are repeated until the amount of moisture in the exhaust gas falls below a prescribed concentration.

In this manner, by providing inert gas supply path 122 and high thermal conductivity gas supply path 123 for the purge gas supply paths, and by using a suitably mixed purge gas of inert gas and high thermal conductivity gas during baking purging treatment, compared with the case of performing purging treatment using only an inert gas, the amount of time required for purging treatment can be reduced considerably. Furthermore, the mixing ratio of inert gas and high thermal conductivity gas can be suitably set according to actual film formation conditions.

By providing moisture meter 141, which continuously measures the amount of moisture in the exhaust gas, the end point of purging treatment can be reliably determined. In addition, by performing purging treatment of reactor 112 prior to film formation using vacuum pump 142 by repeating a plurality of cycles of batch purging comprised of introduction of purge gas and vacuum purging, purging treatment can be performed efficiently in a short time.

Furthermore, purging treatment optimal for the state of the CVD apparatus can be performed by suitably combining the above batch purging and baking purging.

PREFERRED EMBODIMENTS OF THE PRESENT INVENTION

To begin with, purging effects were compared between purging treatment using only inert gas of the background art and purging treatment using a mixed gas of inert gas and high thermal conductivity gas. After sufficiently performing purging in advance so that the moisture concentration in the gas discharged from reactor 112 was 0.1 ppm or less, the door between reactor 112 and glove box 113 was opened for 15 minutes, which is the standard time when installing a wafer during actual film formation operation, while allowing nitrogen gas to flow through.

Figure 2:
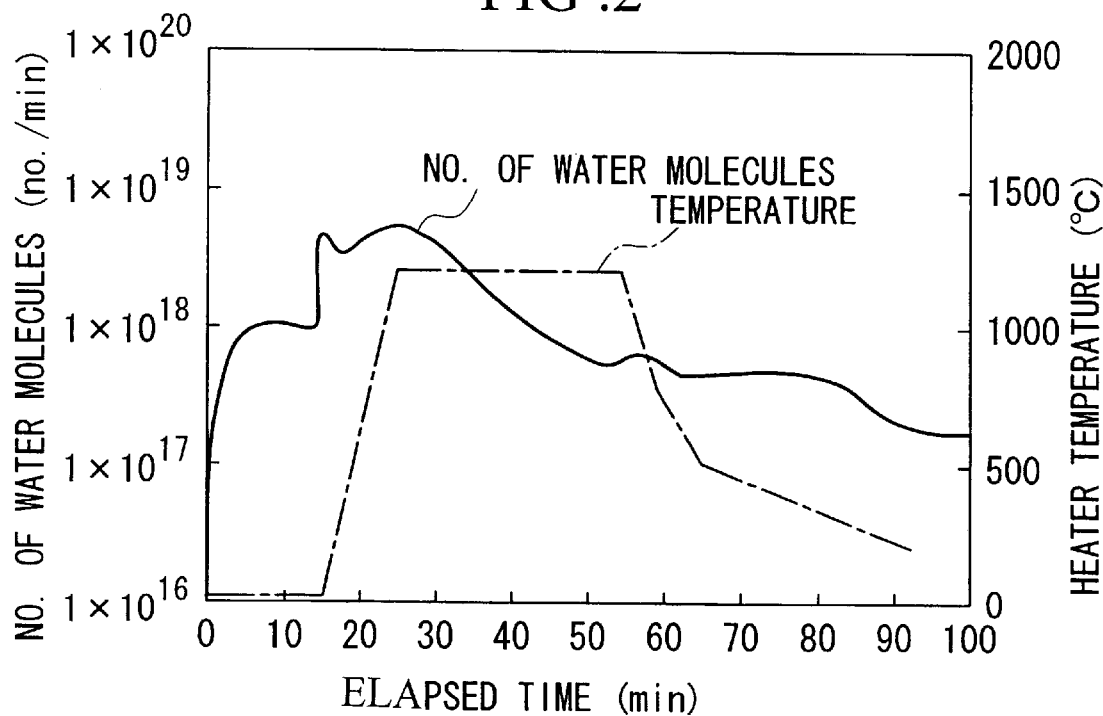
FIG. 2 is a drawing showing the time dependence of water molecule discharge volume during the time baking purging is performed using nitrogen gas only.

After closing the above door, purge gas in the form of nitrogen gas was allowed to flow through reactor 112, and after the amount of discharged water molecules in the exhaust gas had stabilized, the heater was heated to 120° C. After waiting for 40 minutes, heating of the heater was stopped and the temperature was allowed to lower gradually. The amount of moisture in the exhaust gas during the time this baking purging was performed was then measured. Those results are shown in FIG. 2. Furthermore, the amount of nitrogen gas supplied (flow volume per minute) was 24 liters until 14 minutes after the start of purging, 34 liters from 14 to 15 minutes, 38 liters from 15 minutes to 55 minutes, and 184 liters at 55 minutes and after.

Figure 3:
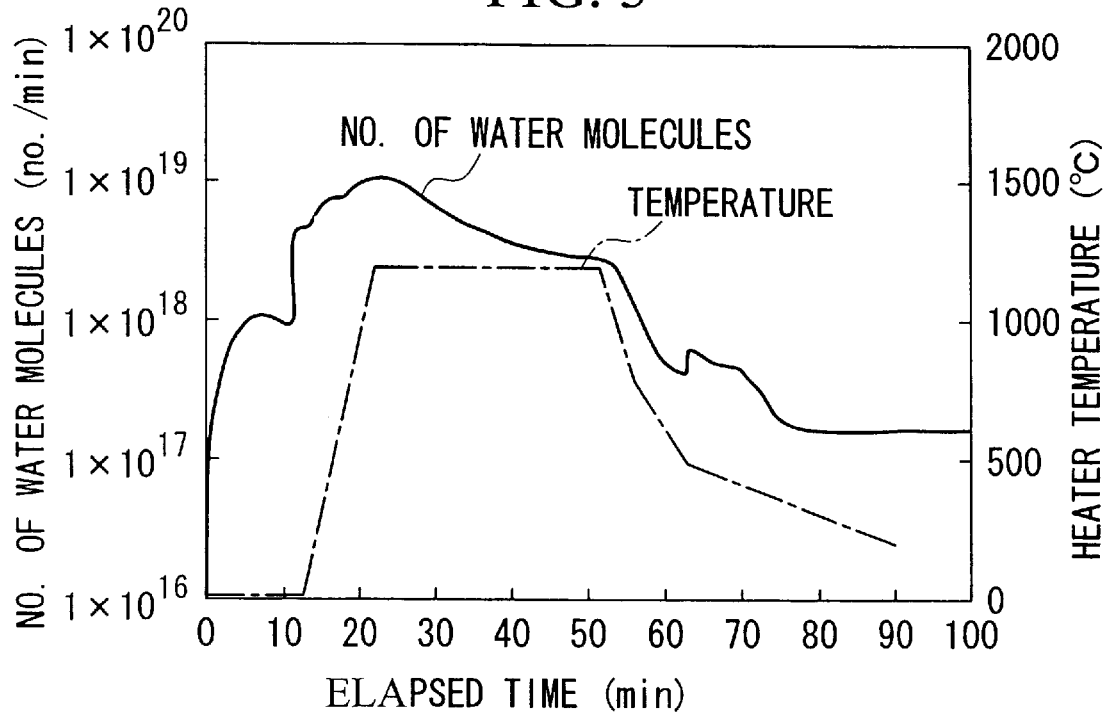
FIG. 3 is a drawing showing the time dependence of water molecule discharge volume during the time baking purging is performed using mixture of nitrogen and hydrogen gas.

In addition, the amount of moisture in the exhaust gas was similarly measured using a nitrogen-hydrogen mixed. gas consisting of a mixture of nitrogen gas and hydrogen gas for the purge gas during baking purging. Those results are shown in FIG. 3. The respective amounts of nitrogen gas and hydrogen gas supplied at this time (flow volume per minute) were 20 liters of nitrogen and 4 liters of hydrogen until 11 minutes after the start of purging, 30 liters of nitrogen and 4 liters of hydrogen from 11 to 12 minutes, 78 liters of nitrogen and 60 liters of hydrogen from 12 minutes to 53 minutes, and 184 liters of nitrogen only at 53 minutes and after.

Furthermore, the amounts of moisture in FIGS. 2 and 3 indicate the discharged amounts of water molecules per unit time since differences in the purge gas and flow volume conditions are ignored. In addition, high-purity nitrogen gas from purge gas supply path 124 constantly flows through glove box 113, and the moisture concentration inside glove box 113 is constant.

When comparing FIGS. 2 and 3, the discharged amounts of water molecules rise rapidly to reach a peak roughly 15 minutes after the start of heating, and then gradually decrease while holding the temperature at 1200° C. In addition, the discharge amounts of water molecules during heating are lower for nitrogen only, while the discharged amounts of water molecules after heating is stopped are lower for the nitrogen hydrogen mixed gas.

The amount of time until the discharged amount of water molecules after heating is stopped (when the temperature starts to drop) reaches $2 \times 10^{17}$ (molecules/min) is at least 10 minutes sooner for the nitrogen-hydrogen mixed gas, indicating that the time required for purging treatment can be shortened. In addition, since the coefficient of thermal conductivity of hydrogen is roughly 10 times larger than nitrogen, the temperatures of the reactor walls and surrounding fine portions is higher for the nitrogen-hydrogen mixed gas even for the same heater temperature. Since the amount of moisture that is released increases, the total number of water molecules discharged during measurement for 100 hours was $3.94 \times 10^{20}$ (molecules) in the case of nitrogen only, while that in the case of the nitrogen-hydrogen mixed gas increased to $8.20 \times 10^{20}$ (molecules). Namely, the efficiency of baking purging can be understood to be improved by increasing the coefficient of thermal conductivity of the purge gas by mixing hydrogen, having a high coefficient of thermal conductivity, into the purge gas. Similar effects are obtained even when helium is used, which also has a high coefficient of thermal conductivity in the same manner as hydrogen.

Next, an experiment was conducted to confirm the effect of repeating batch purging that combines the use of vacuum purging. Similar to that described above, after performing purging until the moisture concentration in the exhaust gas was 0.1 ppm or less, the door between reactor 112 and glove box 113 was opened for 15 minutes. During the 0 cycle,of batch purging, the moisture concentration in the exhaust gas was measured after closing the door and allowing nitrogen gas to flow through reactor 112 at 24 liters per minute and normal temperature.

During the first cycle of batch purging, evacuation was performed until the pressure inside reactor 112 reached 6.65 Pa after closing the above door and stopping the supply of nitrogen gas. The moisture concentration in the exhaust gas was then measured while allowing nitrogen gas to flow through reactor 112 at 24 liters per minute. In the case of two cycles of batch purging, nitrogen gas was introduced into reactor 112 and sealed inside for 10 minutes until the inside of reactor 112 reached atmospheric pressure after the first drawing of a vacuum. This was followed by the second drawing of a vacuum. Namely, the procedure was performed in the order of opening and closing the door, drawing a vacuum, introducing nitrogen gas, holding at atmospheric pressure, drawing a vacuum, introducing nitrogen gas and allowing it to flow through reactor 112.

Figure 4:
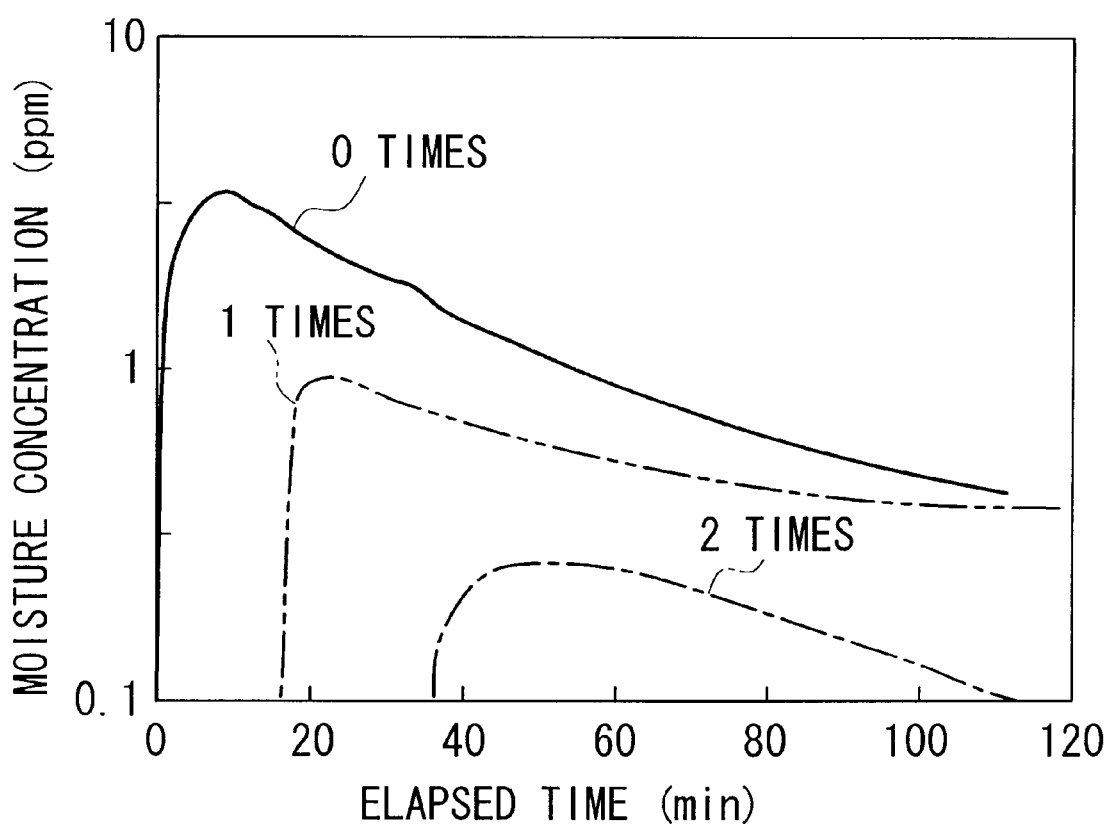
FIG. 4 is a drawing showing the relationship between the number of batch purging cycles and the time-based changes in the amount of water molecules present in exhaust gas.

Changes in moisture concentration during the 0, first and second cycles of batch purging when the closing of the above door is taken to be the starting point are shown in FIG. 4. As is clear from FIG. 4, even when considering the amount of time required to draw a vacuum, the time required for purging treatment (dry down) can be seen to be able to be shortened by performing batch purging. In addition, the effect can be seen to become more prominent as a result of repeating twice as opposed to repeating once.

At this time, since the amount of moisture in the exhaust gas when approximately 110 minutes have elapsed can be determined to have fallen to 0.1 ppm or less when batch purging is repeated twice by continuously measuring the amount of moisture with moisture meter 141, a routine film formation procedure can be started at this time. In addition, even if there are differences in the effects of purging according to the usage history of the CVD apparatus, since completion of purging treatment can be accurately determined, it is possible to nearly completely eliminate the wasted epitaxial growth of the background art.

B. Method for Judging Maintenance Times of Semiconductor Production Apparatuses The following provides an explanation of one embodiment of the method for judging maintenance times of semiconductor production apparatuses as claimed in the present invention with reference to FIGS. 5 through 7.

In these drawings, reference numeral 1 indicates a process chamber, 2 a transport chamber, 3 a carrying-in load locking chamber, 4 a carrying-out load locking chamber, and 5 a process moisture meter.

Figure 5:
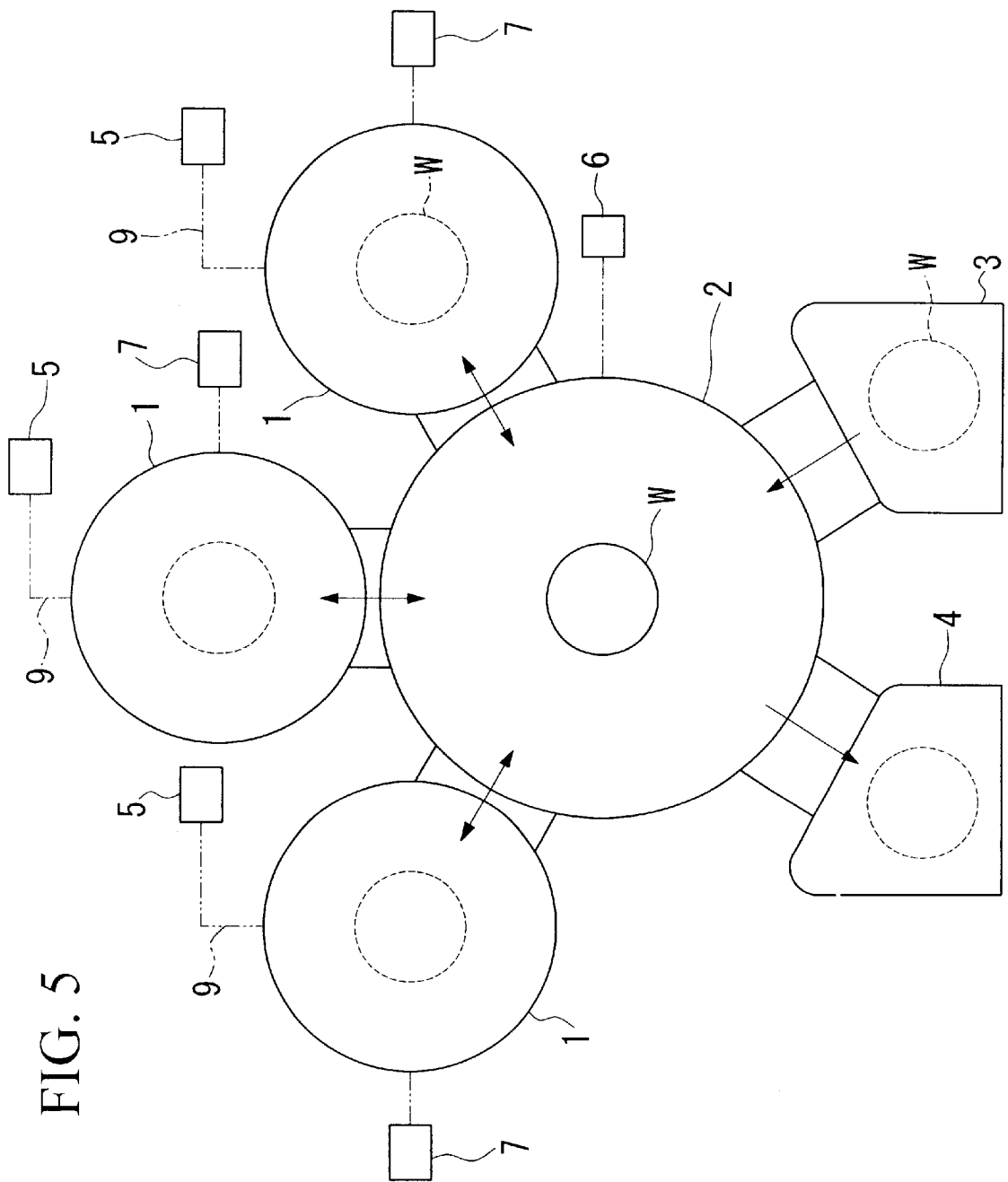
FIG. 5 is schematic overall top view showing an epitaxial crystal growth apparatus in one embodiment of the method for judging maintenance times of a semiconductor production apparatus as claimed in the present invention.

FIG. 5 indicates the case of applying the semiconductor production apparatus of the present invention to, for example, a single wafer epitaxial crystal growth apparatus. As shown in FIG. 5, said epitaxial crystal growth apparatus is equipped with three quartz process chambers (reaction chambers) 1, which are hollow sealed containers in which silicon wafer (wafer) W is arranged inside, transport chamber 2, which replaces the atmosphere in the sealed space inside when carrying silicon wafer W into these process chambers 1, carry-in load lock chamber 3, which carries in silicon wafer W before processing to said transport chamber 2, and carry-out chamber load lock chamber 4, for removing silicon substrate W after processing from transport chamber 2.

Each of the above process chambers 1 is provided with process moisture meter 5, which measures contained in gas by sampling gas introduced into said process chambers 1, and pressure gauge 7, which measures the pressure in process chambers 1.

In addition, although it is preferable that transport system moisture meter 6, which measures moisture in the atmosphere in transport chamber 2, be a laser moisture meter having, for example, that similar to moisture meter body 10 to be described later that has high accuracy and response rate, it may also be an electrostatic capacitance type of moisture meter, which adsorbs moisture onto an alumina capacitor and so forth to measure the change in its electrostatic capacitance, or a moisture meter that uses mass spectrophotometry.

In addition to the above process chambers 1 being connected to a corrosive gas or other gas supply source (not shown) and allowing gas ($SiCl_2H_2$, $SiCl_3H$, $HCl$, $H_2$, $N_2$, $B_2H_6$, $PH_3$, etc.) to be introduced from said gas supply source, the above process chambers 1 are connected to exhaust gas treatment equipment (not shown) through a gas exhaust system and allow corrosive gas and so forth to be discharged to exhaust gas treatment equipment after being supplied to the reaction in process chambers 1.

Figure 6:
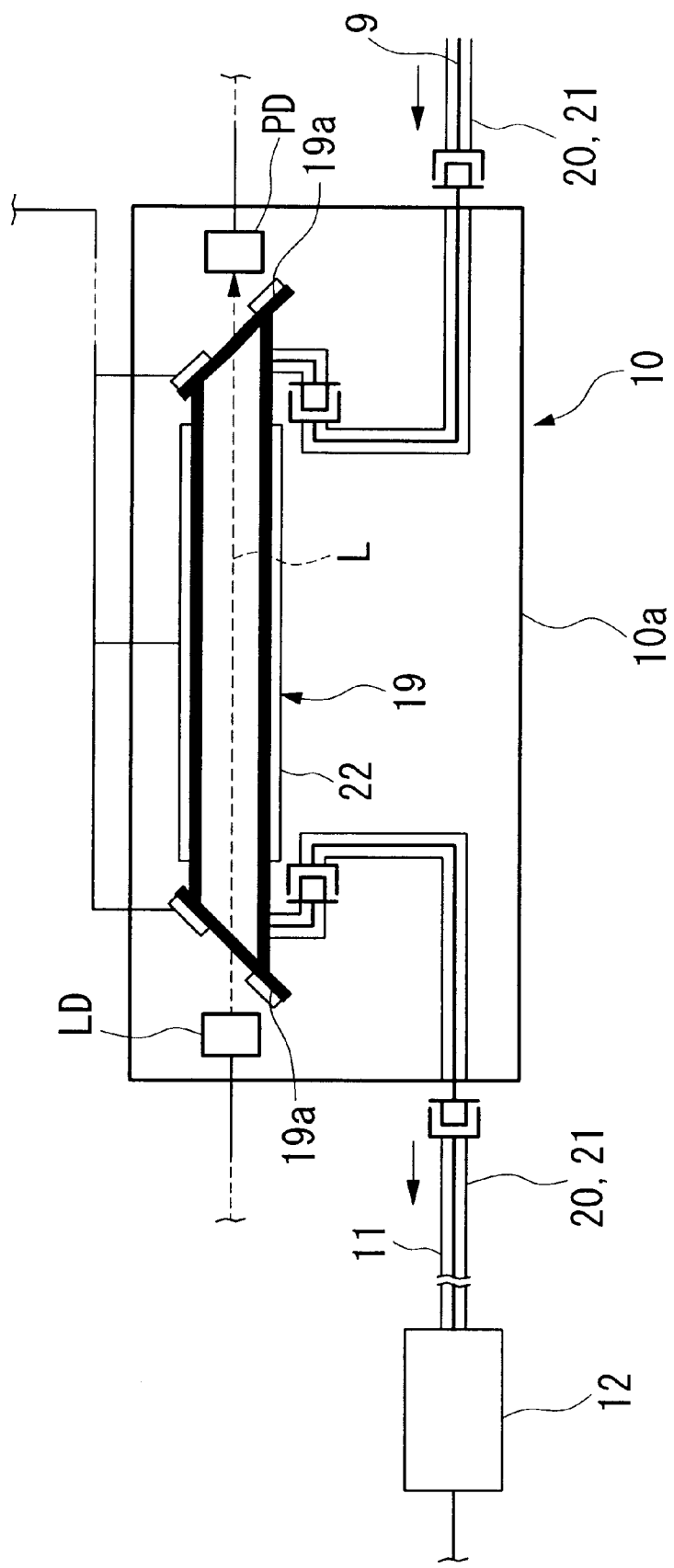
FIG. 6 is a cross-sectional view showing the composition of a process moisture meter in one embodiment of the method for judging maintenance times of a semiconductor production apparatus as claimed in the present invention.

As shown in FIG. 6, the above process moisture meter 5 is equipped with a sample line in the form of sampling pipe 9, one end of which is connected through the gas exhaust system and a valve (not shown) of process chambers 1, moisture meter body 10, which is connected to the other end of said sampling pipe 9 and measures moisture contained in corrosive gas from process chambers 1, and rotary pump 12, which is connected through connection pipe 11 to the rear end of said moisture meter body 10.

The above moisture meter body 10 is provided with tubular cell body 19 inside case 10a, and together with sampling pipe being connected to one end of said tubular cell body 19, connection pipe 11 is connected to the other end. Translucent window members 19a are installed on both ends of tubular cell body 19, and tunable diode laser LD, which generates infrared laser light L (wavelength: 1.3–1.55 $\mu$m), is provided in opposition to the outside of one translucent window member 19a. Photodetector PD, which receives infrared laser light L that has passed through tubular cell body 19 and converts its reception intensity into an electrical signal, is provided in opposition to the outside of the other translucent window member 19a.

Furthermore, ribbon heater 20 connected to a current supply source (not shown) is coiled around the above sampling pipe 9 and the above connection pipe 11, and silicon rubber insulator 21 is additionally coiled over said heater ribbon 20. Furthermore, ribbon heater 20 heats sampling pipe 9 and connection pipe 11 to 100° C. or higher by adjusting the current that flows to it to inhibit the adhesion of reaction by-products in these pipes.

In addition, cell heater 22 consisting primarily of heating wires for heating tubular cell body 19 and translucent window member 19a is attached to said tubular cell body 19 and translucent window member 19a of moisture meter body 10, and is heated to 100° C. or higher. Moreover, adjustment and calibration of the measurement sensitivity of moisture meter body 10 are performed in advance corresponding to the temperature of the gas heated to 100° C. or higher by ribbon eater 20 and cell heater 22.

Figure 7:
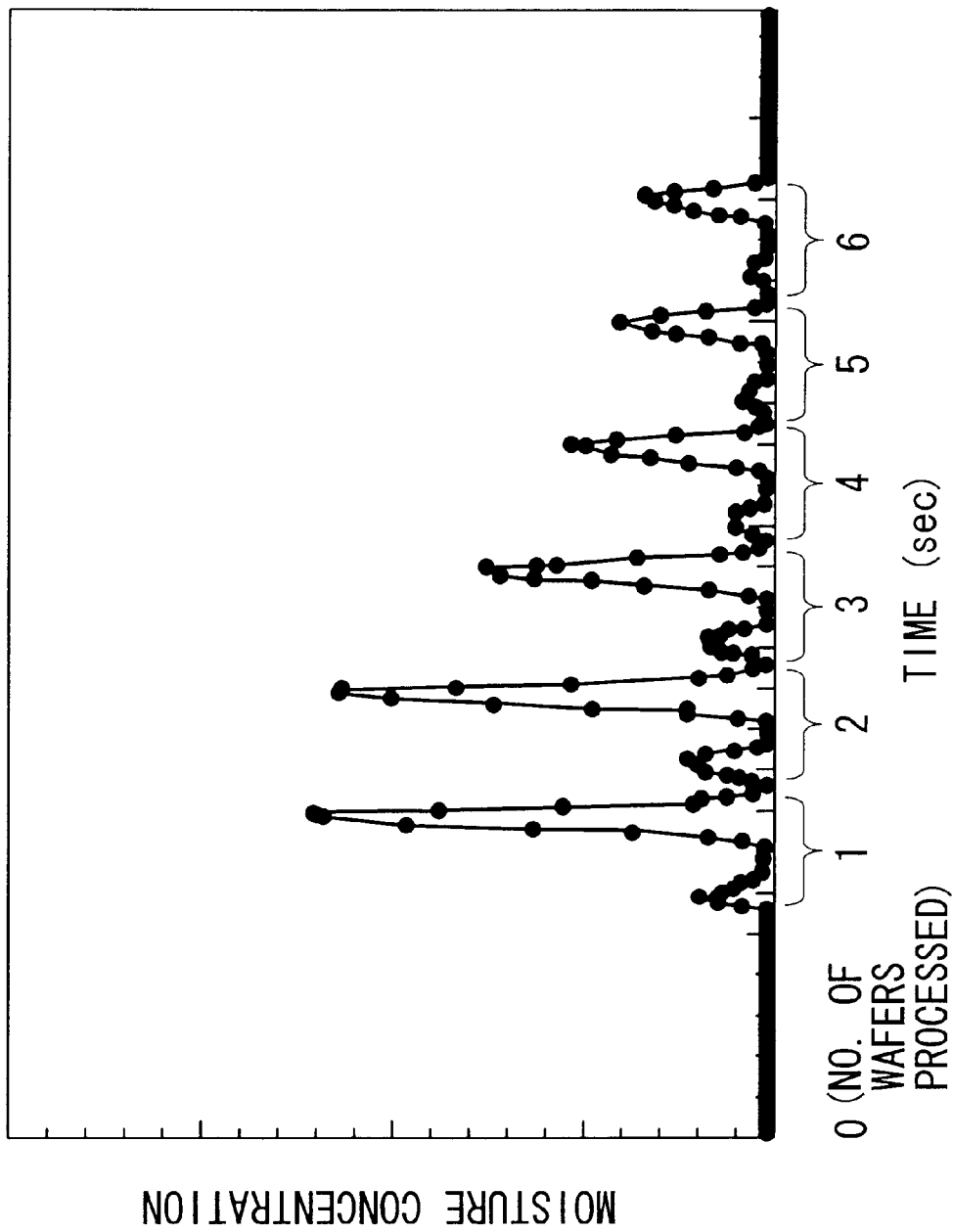
FIG. 7 is a graph showing the changes in moisture concentration as measured during repeated film growth treatment in one embodiment of the method for judging maintenance times of a semiconductor production apparatus as claimed in the present invention.

Next, an explanation is provided of the method for judging maintenance times of epitaxial crystal growth apparatuses in the present embodiment using FIG. 7.

To begin with, an explanation is provided of the process wherein epitaxial growth is performed on silicon wafer W using the above growth apparatus. Together with silicon wafer W being carried into transport chamber 2 from carry-in load lock chamber 3 and the atmosphere in transport chamber 2 being replaced with an inert gas such as $N_2$, after measuring the moisture in the atmosphere with transport system moisture meter 6 and confirming the state in which the moisture has sufficiently decreased, silicon wafer W is transported into process chamber 1.

Although a purged state is created inside process chamber 1 prior to processing by purging with an inert gas such as $N_2$, after arranging silicon wafer W that has been introduced from transport chamber 2 and heating to the prescribed temperature, the prescribed corrosive gas, etc. is introduced followed by performing epitaxial growth on the surface of silicon wafer W. At this time, together with driving rotary pump 12, a valve, etc. of sampling pipe 9 is opened and while adjusting the flow volume, a portion of the corrosive gas, etc. supplied and heated for the reaction in process chamber 1 is constantly introduced to moisture meter body 10 through sampling pipe 9.

The sampled gas flows into tubular cell body 19 inside moisture meter body 10, and infrared laser light L is radiated from semiconductor laser LD. Infrared laser light L that has passed through the gas in tubular cell body 19 is received by photodetector PD, and the moisture concentration of the gas is measured according to the absorption spectrum intensity obtained from the amount of light received to quantitatively analyze the moisture contained in the gas. Furthermore, gas that has flowed into tubular cell body 19 is discharged to the exhaust system through connection pipe 11 and rotary pump 12. In addition, the pressure in process chamber 1 is constantly measured by pressure gauge 7.

Following completion of epitaxial growth, the inside of process chamber 1 is replaced with inert gas, and the treated silicon wafer W is carried out from carry-out load lock chamber 4 through transport chamber 2.

Although epitaxial growth is sequentially performed on a plurality of silicon wafers W by repeating the above treatment, at that time, the moisture concentration of process chamber 1 is constantly measured by process moisture meter 5 as shown in FIG. 7 and its hysteresis is recorded. Furthermore, although large and small peaks of moisture concentration during film formation treatment of a single wafer are detected in FIG. 7, the small peaks represent the moisture concentrations during actual film formation, while the large peaks represent the moisture concentration during etching of polysilicon adhered inside the chamber by HCl (hydrogen chloride).

As can be understood from FIG. 7, moisture concentration gradually decreases as the number of wafers treated increases. Since the amount of moisture decrease is considered to be equivalent to the amount of moisture actually taken into process chamber 1 and supplied to reaction for corrosion, particles and so forth, the cumulative amount of moisture of moisture from the previous round of maintenance take into process chamber 1 is calculated based on this change in moisture concentration (decrease in moisture concentration), and the next round of maintenance is determined according to said cumulative amount. Namely, together with estimating the transition in the cumulative amount of moisture from the change in the measured moisture concentration, and setting the time when a prescribed cumulative amount is reached as the time of the next round of maintenance, maintenance is performed at the time the cumulative amount of moisture calculated from the change in moisture concentration actually reaches the prescribed cumulative amount. Furthermore, the maximum number of wafers treated is preset based on other factors (adhesion of by-products inside the piping). Although the above maintenance is performed in the case the above prescribed cumulative amount is reached at a time earlier than this maximum number of wafers treated, maintenance is performed at the time this maximum number of wafers treated is reached in the case the moisture concentration is low and the time at which the prescribed cumulative amount is reached is later than the time at which this maximum number of wafers treated is reached.

In the present embodiment, since maintenance times are determined according to the cumulative amount of moisture as calculated from changes in moisture concentration, the amount of moisture actually taken into process chamber 1 can be accurately estimated, and maintenance can be performed at suitable times. Thus, together with being able to determine the time of the next round of maintenance according to the amount of moisture actually taken in that differs for each round of maintenance to constantly maintain favorable film formation treatment, throughput can be improved as a result of it being possible to reduce the number of times maintenance is performed and extend maintenance intervals.

In addition, since the pressure in process chamber 1 is similarly measured constantly by pressure gauge 7, the flow status of exhaust system piping (e.g., pressure fluctuations in process chamber 1 that occur due to obstruction of piping due to adhesion of reaction by-products) can be detected. By then estimating maintenance times by considering the above cumulative amount of moisture with the above changes in pressure, more suitable maintenance times can be determined. Furthermore, estimating the time of the next round of maintenance by combining data on the defect occurrence rate and so forth during production with the above cumulative amount of moisture and the above changes in pressure makes it possible determine even more suitable maintenance times.

Furthermore, since the moisture concentration and pressure in process chamber 1 are measured constantly, in the case those changes exhibit an abnormal trend relative to normal performance, the cause of the abnormal trend and maintenance work can be performed immediately in response to its occurrence.

In addition, since the previously mentioned laser moisture meter is used for process moisture meter 5 as a means of detecting moisture concentration, moisture concentration in process chamber 1 can be accurately measured even during processing, enabling maintenance times to be determined with high precision.

Furthermore, the present invention also includes an embodiment like that described below.

Although a vapor phase growth apparatus that performs epitaxial growth was applied as the semiconductor production apparatus in the above embodiment, if the apparatus is that in which corrosive gas is reacted in a reaction chamber, another semiconductor production apparatus may be used. For example, a CVD apparatus that forms another thin film on a wafer, or a dry etching apparatus that performs etching of a wafer surface using corrosive gas may be used.

In addition, although a single wafer type of epitaxial growth apparatus was applied in the above embodiment, the epitaxial growth apparatus is not limited to this type of apparatus, but rather the present invention may be applied to another type of apparatus (such as various batch types of apparatuses).

C. Moisture Monitoring Apparatus and a Semiconductor Production Apparatus Equipped Therewith The provides an explanation of one embodiment of a moisture monitoring apparatus and semiconductor production apparatus equipped therewith in the present invention with reference to FIGS. 8 through 10.

In these drawings, reference numeral 1 indicates a process chamber, 2 a transfer chamber, 3 a carry-in load lock chamber, 4 a carry-out lock load chamber, and 25 a moisture monitoring apparatus.

Figure 8:
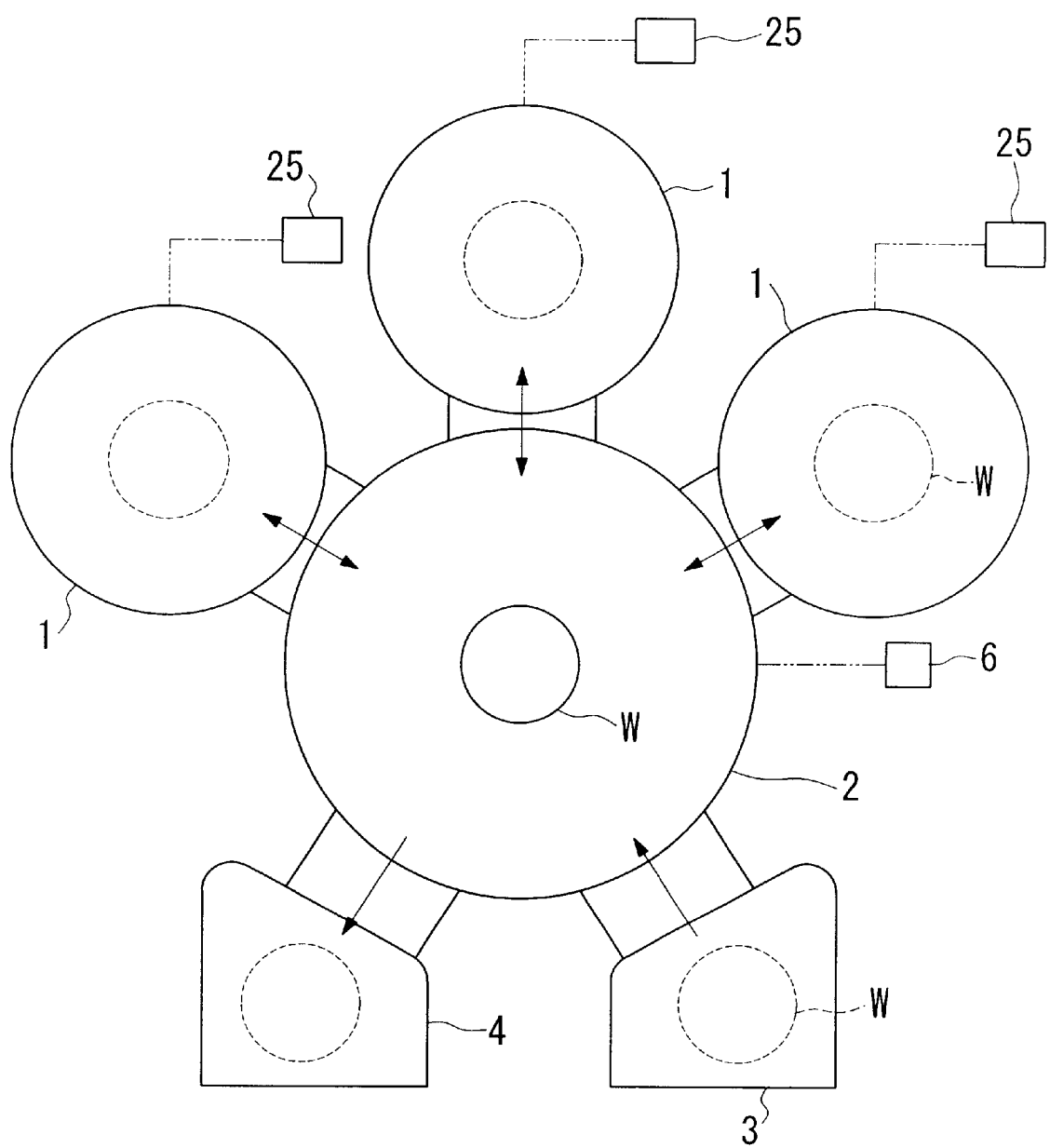
FIG. 8 is a schematic overall overhead view showing an epitaxial crystal growth apparatus in one embodiment of a moisture monitoring apparatus and semiconductor production apparatus equipped therewith as claimed in the present invention.

FIG. 8 shows the case of applying the semiconductor production apparatus of the present invention to, for example, a single wafer type of epitaxial crystal growth apparatus. As shown in FIG. 8, said epitaxial crystal growth apparatus is equipped with three quartz process chambers (reaction chambers) 1 in the form of hollow, sealed containers in which silicon wafers (wafers) W are arranged inside, transport chamber (wafer transport system) 2 that replaces the atmosphere in the sealed space inside when silicon wafers W are carried into these process chambers 1, carry-in load lock chamber 3 that carries in silicon wafers W to said transport chamber 2 prior to processing, and carry-out load lock chamber 4 for taking out silicon wafers W from transport chamber 2 after processing.

Moisture monitoring apparatus 25, which samples corrosive gas introduced into said process chamber 1 and measures the moisture contained in the corrosive gas, is provided in each of the above process chambers 1.

In addition, transport system moisture meter 6, which measures the moisture in the atmosphere in transport chamber 2, is also installed in said transport chamber 2. Although said transport system moisture meter 6 is preferably a laser moisture meter similar to laser moisture meter 10 to be described later having high accuracy and a rapid response rate, a moisture meter of the electrostatic capacitance type that measures changes in electrical capacitance by adsorbing moisture onto an alumina capacitor and so forth, or a moisture meter that uses mass spectrometry, may also be used.

Figure 9:
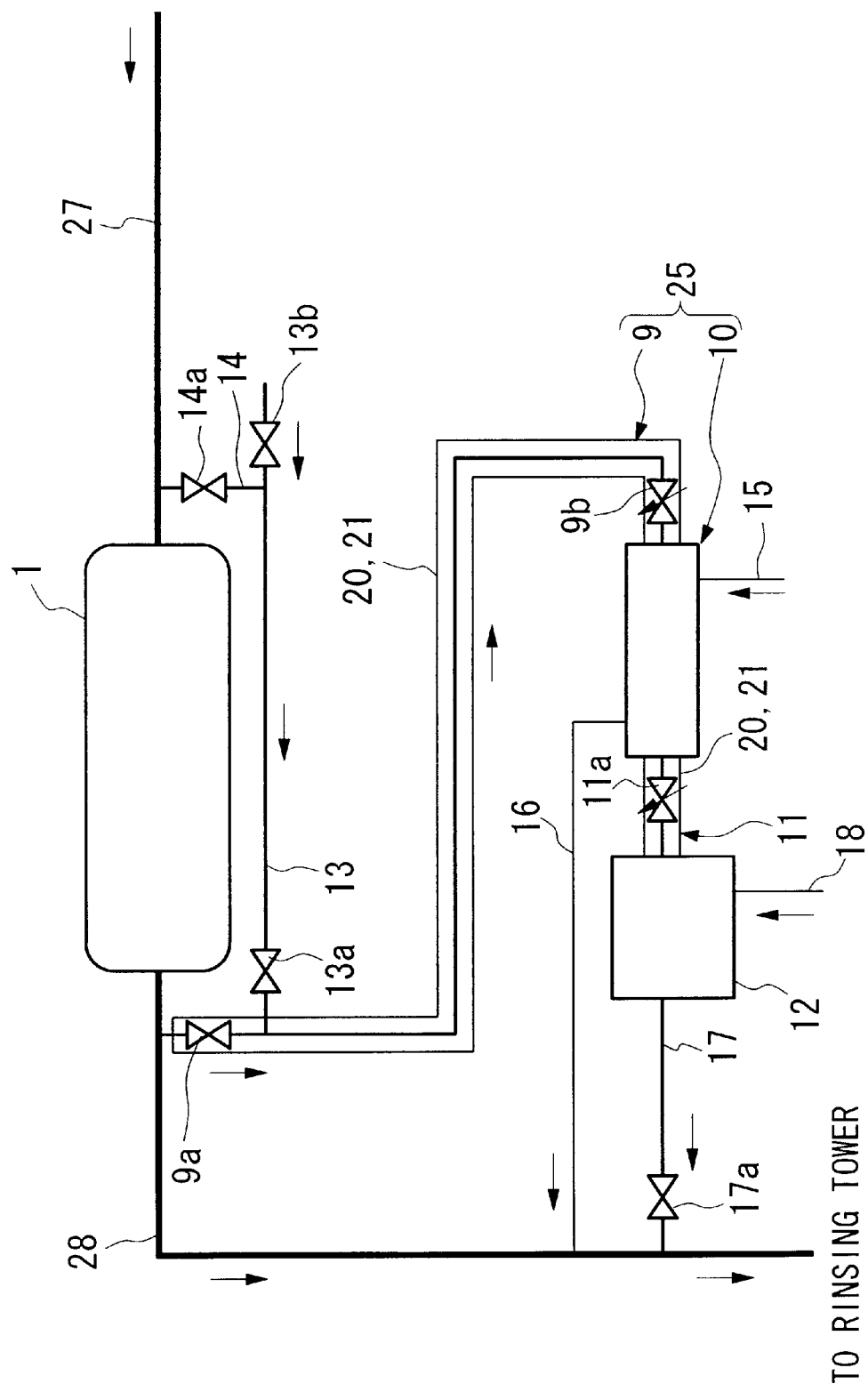
FIG. 9 is a piping drawing showing the composition of a moisture monitoring apparatus in one embodiment of a moisture monitoring apparatus and semiconductor production apparatus equipped therewith as claimed in the present invention.

As shown in FIG. 9, process gas afferent pipe 27, for introducing a gas (such as $SiCl_2H_2$, $SiCl_3H$, HCl, $H_2$, $N_2$, $B_2H_6$ or $PH_3$) from a corrosive gas or other gas supply source (not shown), and process gas exhaust pipe 28, which discharges corrosive gas and so forth into exhaust gas treatment equipment (not shown) after being supplied to the reaction in process chamber 1, are connected to the above process chamber 1.

The above moisture monitoring apparatus 25 is equipped with sampling pipe 9, which is a sample line of which one end equipped with valve 9a is connected to process chamber 1 through the base end of process gas exhaust pipe 28, laser moisture meter 10, which is connected to the other end of said sampling pipe 9 through variable valve 9b and measures the moisture contained in corrosive gas from process chamber 1, and rotary pump 12, which is connected with connection pipe 11 to the rear end of said laser moisture meter 10 through variable valve 11a.

Pipe purge line 13 for $N_2$ purging of the sample line is connected to the base end of the above sampling pipe 9 through valve 13a, and process gas afferent pipe 27 is connected to pipe purge line 13 with branched pipe 14 through valve 14a. Furthermore, pipe purge line 13 is equipped with valve 13b upstream from the connection with branched pipe 14.

Figure 10:
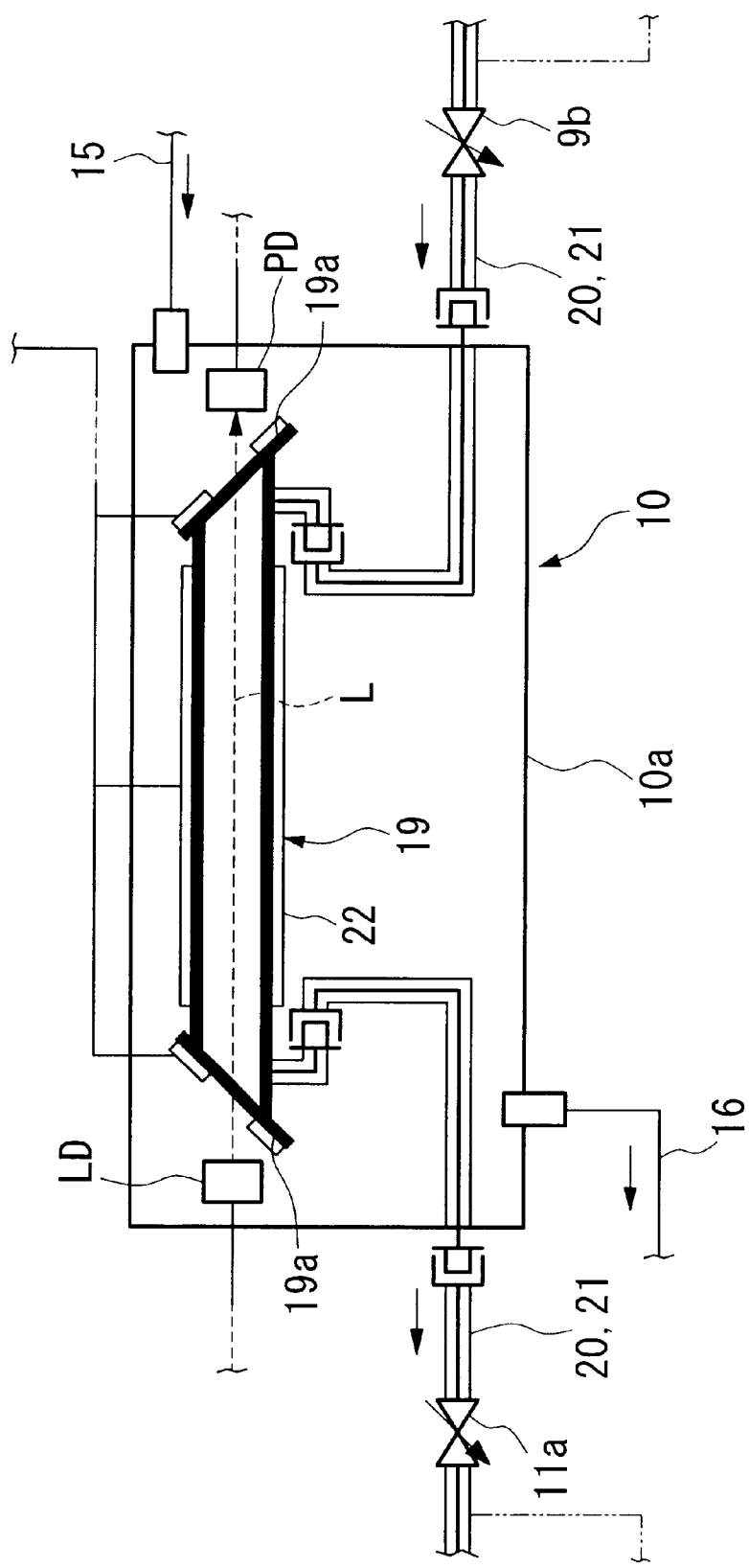
FIG. 10 is a cross-sectional view showing the composition of a laser moisture meter in one embodiment of a moisture monitoring apparatus and semiconductor production apparatus equipped therewith as claimed in the present invention.

As shown in FIGS. 9 and 10, together with case purge line 15 for $N_2$ purging of the inside of case 10a being connected to the above laser moisture meter 10, $N_2$ exhaust line 16, to which the other end is connected, is connected to process gas exhaust pipe 28 for discharging this $N_2$.

Furthermore, the above rotary pump 12 is connected to process exhaust pipe 28 at sampling exhaust pipe 17 through valve 17a. In addition, $N_2$ purge line 18 for gas ballast is connected to rotary pump 12.

As shown in FIG. 10, tubular cell body 19 is provided within case 10a, and together with sampling pipe 9 being connected to one end of said tubular cell body 19, connection pipe 11 is connected to the other end. Translucent window members 19a are attached to both ends of tubular cell body 19, and tunable diode laser LD, which generates infrared laser light L (wavelength: 1.3–1.55 μm), is provided in opposition to the outside of one translucent window member 19, while photodetector PD, which receives infrared laser light that passes through tubular cell body 19 and converts the intensity of that received light into an electrical signal, is provided in opposition to the outside of the other translucent window member 19a.

Ribbon heater (pipe heating mechanism, heating wires) 20 is coiled around the above sampling pipe 9 and connection pipe 11, and silicon rubber insulator 21 is coiled over said ribbon heater 20. Furthermore, ribbon heater 20 is connected to a current supply source not shown. Sampling pipe 9 and connection pipe 11 are heated to about 100° C. by adjusting the current that flows to ribbon heater 20.

In addition, cell heater (cell heating mechanism) 22, consisting mainly of heating wires that heat tubular cell body 19 and translucent window members 19a, is attached to said tubular cell body 19 and translucent window members 19a of laser moisture meter 10, and heats said tubular cell body 19 and translucent window members 19a to about 100° C.

Moreover, adjustment and calibration of the measurement sensitivity of laser moisture meter 10 are performed in advance corresponding to the temperature of the corrosive gas heated to about 100° C. by ribbon heater 20 and cell heater 22.

Next, an explanation is provided of a moisture monitoring method during epitaxial crystal growth in one embodiment of a moisture monitoring apparatus and semiconductor production apparatus equipped therewith as claimed in the present invention.

To begin with, silicon wafer W on which epitaxial growth is performed is carried in to transport chamber 2 from carry-in load lock chamber 3, and the atmosphere in transport chamber 2 is replaced with an inert gas such as $N_2$. At this time, the moisture in the atmosphere is measured by transport system moisture meter 6, and after confirming that the moisture has been sufficiently reduced, silicon wafer W is transported into process chamber 1.

Although the inside of process chamber 1 is purged with an inert gas such as $N_2$ prior to processing, after arranging silicon wafer W that has been carried in from transport chamber 2 and heating to the prescribed temperature, valves 13a, 13b and 14a are closed, the prescribed corrosive gas, etc. is introduced from process gas afferent pipe 27 and epitaxial growth is performed on the surface of silicon wafer W. At this time, together with opening valves 9b and 11a, rotary pump 12 is driven and a portion of the heated corrosive gas supplied to the reaction in process chamber 1 is constantly introduced to laser moisture meter 10 through sampling pipe 9 while adjusting the flow volume with variable valves 9b and 11a.

The sampled corrosive gas flows into tubular cell body 19 within laser moisture meter 10 and is irradiated by infrared laser light L from semiconductor laser LD. Infrared laser light L that has passed through corrosive gas in tubular cell body 19 is received by photodetector PD, and quantitative analysis is performed on the moisture contained in the corrosive gas according to the absorption spectrum intensity obtained from the amount of light received.

Corrosive gas that has flowed into tubular cell body 19 is discharged to process gas exhaust pipe 28 through connection pipe 11, rotary pump 12 and sampling exhaust pipe 17.

Since the present embodiment is equipped with ribbon heater 20 that heats not only laser moisture meter 10, but also sampling pipe 9 and connection pipe 11, sampling pipe 9 and connection pipe 11 can be heated and raised to a high temperature of about 100° C., thereby inhibiting side reactions inside the pipes of corrosive gas heated in process chamber 1, and preventing obstruction of the pipes with reaction by-products. Thus, moisture can be measured at all times in-situ.

Moreover, since adjustment and calibration of the measurement sensitivity of laser moisture meter 10 is performed in advance corresponding to the temperature of corrosive gas heated to about 100° C., moisture concentration can be measured with suitable sensitivity and high precision even in high-temperature corrosive gas. Furthermore, adjustment and calibration of measurement sensitivity is performed, for example, by arithmetic processing of the signal from photodetector PD by a controller (not shown) connected to photodetector PD.

In addition, since transport chamber 2 is equipped with transport system moisture meter 6, which measures moisture of internal sealed space separate from laser moisture meter 10, the moisture inside transport chamber 2 can be measured and confirmed when silicon wafer W is carried into process chamber 1 through transport chamber 2, thereby making it possible to prevent moisture in transport chamber 2 from inadvertently flowing into process chamber 1.

Furthermore, the present invention also includes the following type of embodiment.

Although the present invention was applied to a vapor phase growth apparatus that performs epitaxial growth as a semiconductor production apparatus in the above embodiment, another semiconductor production apparatus may be used provided it reacts corrosive gas on a wafer in a reaction chamber. For example, a CVD apparatus that forms another thin film on a wafer or a dry etching apparatus that etches the wafer surface using corrosive gas may also be used.

In addition, although the present invention is applied to a single-wafer type of epitaxial growth apparatus in the above embodiment, the present invention is not limited to this type of apparatus, but rather the present invention may also be applied to other types of apparatuses (such as various types of batch-type apparatuses) as well.

Moreover, although corrosive gas was introduced as reaction gas after $N_2$ purging of the inside of the pipes and process chambers, purging may also be performed with HCL (hydrogen chloride) after adequate $N_2$ purging followed by introducing the corrosive gas to be supplied for growth. In this case, moisture adsorbed onto the inside walls of pipes and process chambers is carried out as a result of bonding with HCl molecules, making it possible to reduce the amount of moisture that enters the corrosive gas to be supplied later.

What is claimed is:

1. A CVD apparatus, comprising:
   a reaction chamber in which a wafer is placed to form a semiconductor film on said wafer;
   a material gas supply path that supplies semiconductor material gas to the reaction chamber;
   an inert gas supply path that supplies inert gas to the reaction chamber for purging;
   a high thermal conductivity gas supply path that supplies gas having a high coefficient of thermal conductivity, that mixes with purge gas, to said reaction chamber;
   a moisture meter that measures the amount of moisture in gas exhausted from the reaction chamber; and
   a vacuum pump that evacuates the inside of the reaction chamber.

2. A CVD apparatus according to claim 1, further comprising:
   a reactor exhaust path that discharges gas from the reaction chamber;
   an analysis path that branches from the reactor exhaust path;
   a main exhaust path that branches from the reactor exhaust path; and
   an evacuation path that branches from the main exhaust path, wherein
   the moisture meter that measures the moisture in the gas discharged from the reaction chamber is provided in the analysis path and the vacuum pump that evacuates the reaction chamber is provided in the evacuation path.

3. A CVD apparatus according to claim 1, wherein the gas having a high coefficient of thermal conductivity is one of hydrogen and helium.

4. A moisture monitoring apparatus, comprising:
   a pipe having one end connected to a reaction chamber into which flows corrosive gas;
   a moisture meter, connected to the other end of said pipe, that measures moisture contained in the corrosive gas introduced from said reaction chamber; and
   a pipe heating mechanism that heats said pipe, wherein a measurement sensitivity of the moisture meter can be adjusted corresponding to the temperature of the corrosive gas.

5. A moisture monitoring apparatus according to claim 4 wherein said pipe heating mechanism is equipped with a heating wire coiled around the outside of said pipe.

6. A moisture monitoring apparatus according to claim 4 wherein said moisture meter is a laser moisture meter that directs laser light into a tubular cell body connected to the other end of said pipe and measures the absorption spectrum of the transmitted laser light.

7. A moisture monitoring apparatus according to claim 6 wherein said moisture meter is equipped with a cell heating mechanism that heats said tubular cell body.

8. A semiconductor production apparatus that allows corrosive gas to flow onto a wafer in a reaction chamber and reacts the corrosive gas on the surface of the wafer, and is equipped with the moisture monitoring apparatus according to claim 4.

9. A semiconductor production apparatus according to claim 8 that is equipped with a wafer transport system that transports a wafer through sealed space to said reaction chamber, said wafer transport system being equipped with a moisture meter that measures moisture in said sealed space separate from said moisture meter.

* * * * *

UNITED STATES PATENT AND TRADEMARK OFFICE
CERTIFICATE OF CORRECTION

PATENT NO.    : 6,491,758 B1
DATED         : December 10, 2002
INVENTOR(S)   : Hasegawa et al.

It is certified that error appears in the above-identified patent and that said Letters Patent is hereby corrected as shown below:

<u>Title page,</u>
Item [75], please add the following third inventor:
-- Yoshio Ishihara, Tokyo, (JP) --.

Signed and Sealed this

Twenty-third Day of September, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,491,758 B1
DATED : December 10, 2002
INVENTOR(S) : Hasegawa et al.

It is certified that error appears in the above-identified patent and that said Letters Patent is hereby corrected as shown below:

<u>Title page,</u>
Item [54], Title, please replace the existing title and replace with:
-- CVD APPARATUS, ITS PURGING METHOD, METHOD FOR JUDGING MAINTENANCE TIMES OF SEMICONDUCTOR PRODUCTION APPARATUSES, MOISTURE MONITORING APPARATUS AND SEMICONDUCTOR PRODUCTION APPARATUS EQUIPPED THEREWITH --

Signed and Sealed this

Twenty-ninth Day of June, 2004

JON W. DUDAS
*Acting Director of the United States Patent and Trademark Office*